(12) United States Patent
Werking

(10) Patent No.: US 7,969,224 B2
(45) Date of Patent: Jun. 28, 2011

(54) CIRCUIT TO REDUCE DUTY CYCLE DISTORTION

(75) Inventor: Paul M. Werking, Rockford, MN (US)

(73) Assignee: Honeywell International, Inc., Morristown, NJ (US)

( * ) Notice: Subject to any disclaimer, the term of this patent is extended or adjusted under 35 U.S.C. 154(b) by 27 days.

(21) Appl. No.: 12/486,579

(22) Filed: Jun. 17, 2009

(65) Prior Publication Data

US 2009/0322396 A1   Dec. 31, 2009

Related U.S. Application Data

(63) Continuation-in-part of application No. 11/688,649, filed on Mar. 20, 2007, now abandoned.

(51) Int. Cl.
*H03K 17/62* (2006.01)
(52) U.S. Cl. .................. 327/407; 327/218
(58) Field of Classification Search .......... 327/63, 327/64, 65, 66, 69, 70, 202, 218, 219, 407, 327/408, 409, 410
See application file for complete search history.

(56) References Cited

U.S. PATENT DOCUMENTS

| | | | |
|---|---|---|---|
| 4,354,243 A * | 10/1982 | Ryan et al. .................. 382/300 |
| 4,604,615 A * | 8/1986 | Funahashi .................... 345/567 |
| 4,728,900 A * | 3/1988 | Nakagawara et al. ........ 330/253 |
| 5,149,992 A | 9/1992 | Allstot |
| 5,227,671 A * | 7/1993 | Ehrlich ......................... 327/108 |
| 5,537,660 A * | 7/1996 | Bond et al. ....................... 710/58 |
| 5,793,236 A * | 8/1998 | Kosco ............................ 327/218 |
| 5,798,658 A | 8/1998 | Werking |
| 5,920,208 A * | 7/1999 | Park ................................ 327/54 |
| 6,229,353 B1 | 5/2001 | Werking |
| 6,323,710 B1 * | 11/2001 | Piguet et al. ................... 327/218 |
| 6,624,677 B1 * | 9/2003 | Wissel ............................ 327/202 |
| 6,833,739 B2 * | 12/2004 | Isoda ............................. 327/108 |
| 6,870,403 B2 * | 3/2005 | Horie et al. ..................... 327/63 |
| 6,967,515 B2 * | 11/2005 | Paillet et al. ................... 327/175 |
| 7,023,254 B2 * | 4/2006 | Choi et al. ..................... 327/175 |
| 7,102,932 B2 * | 9/2006 | Baker ....................... 365/189.05 |
| 7,265,599 B1 * | 9/2007 | Pasqualini ..................... 327/202 |
| 2008/0231335 A1 | 9/2008 | Werking |

* cited by examiner

*Primary Examiner* — Jeffrey S Zweizig

(74) *Attorney, Agent, or Firm* — Shumaker & Sieffert, P.A.

(57) ABSTRACT

A method and a circuit for correcting duty cycle distortion. A delay insertion gate corrects data dependent delay distortion that is generated by CMOS flip-flop circuits. The delay insertion gate includes two field effect transistors and a current mirror. The two transistors each respectively receive an input signal from an upstream circuit. At least one of the transistors is coupled to an output node. The output node temporarily holds a voltage state within the delay insertion gate, correcting any distortion in the duty cycle of the input signals.

20 Claims, 14 Drawing Sheets

(a) slow high

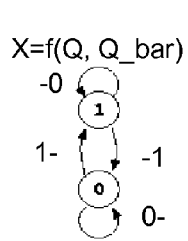
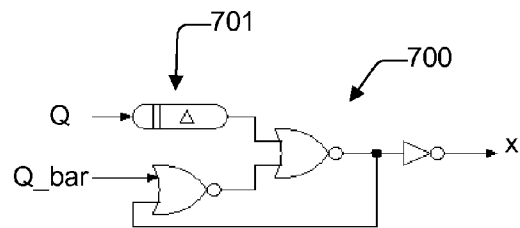
Fig. 7a  Fig. 7b  Fig. 7c
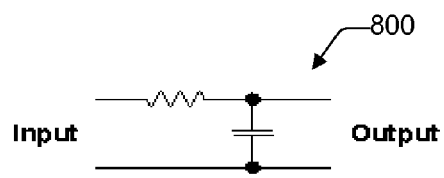
Fig. 8
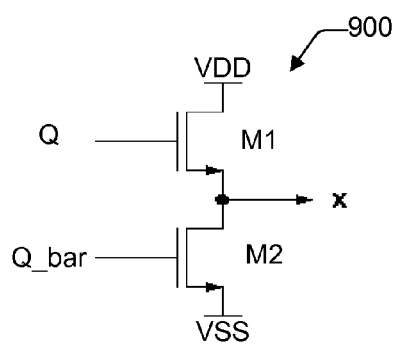
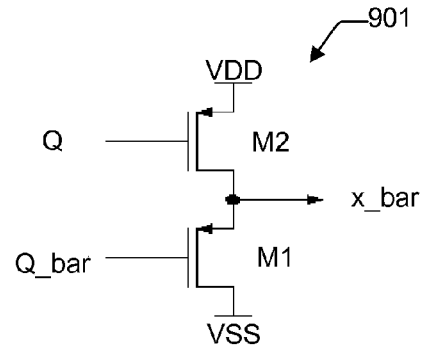
Fig. 9a  Fig. 9b

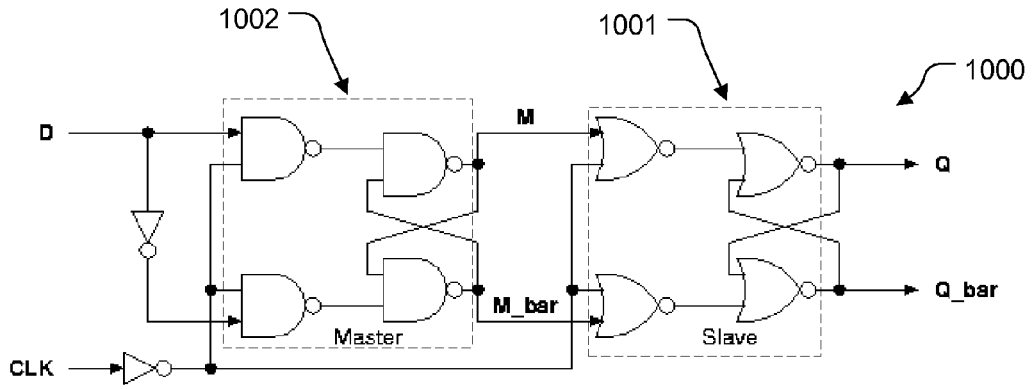
Fig. 10
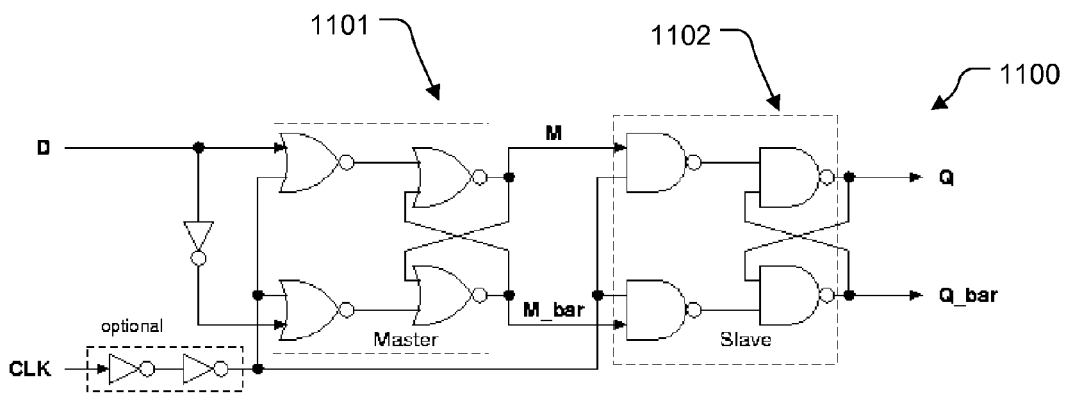
Fig. 11
| Q | Q_bar | M1 | M2 | X |
|---|---|---|---|---|
| 1 | 0 | ON | OFF | 1 |
| 0 | 0 | OFF | OFF | oldX=1 |
| 0 | 1 | OFF | ON | 0 |
| 0 | 0 | OFF | OFF | oldX=0 |
Fig. 12a
| Q | Q_bar | M1 | M2 | X_bar |
|---|---|---|---|---|
| 1 | 0 | ON | OFF | 0 |
| 1 | 1 | OFF | OFF | oldX_bar=0 |
| 0 | 1 | OFF | ON | 1 |
| 1 | 1 | OFF | OFF | oldX_bar=1 |
Fig. 12b

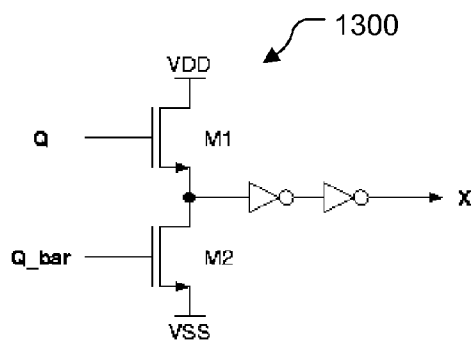
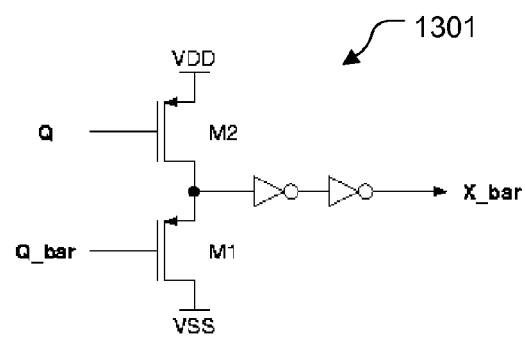
Fig. 13a  Fig. 13b
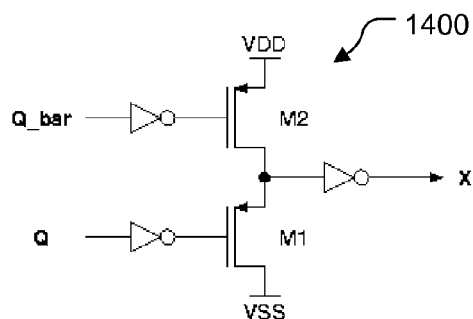
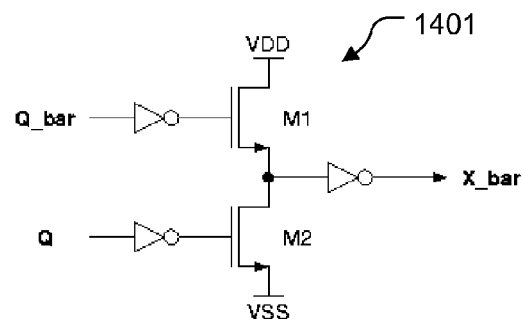
Fig. 14a  Fig. 14b

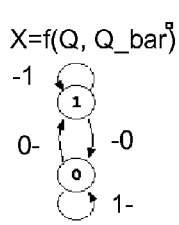 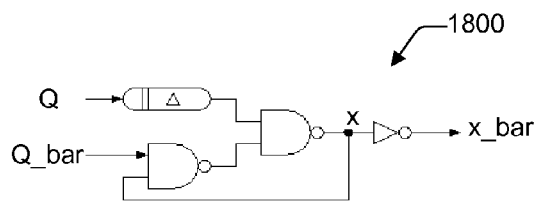
Fig. 18a        Fig. 18b        Fig. 18c
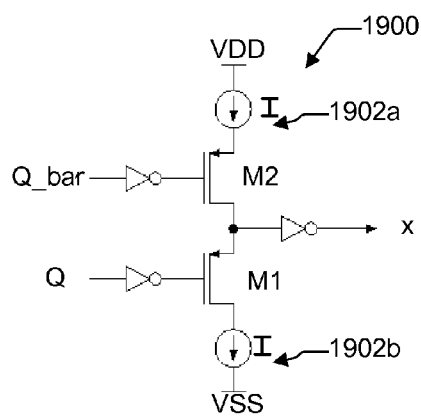 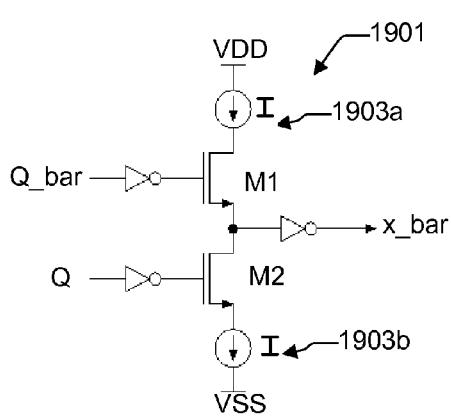
Fig. 19a        Fig. 19b
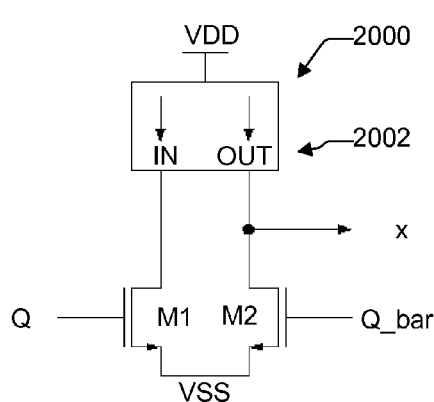 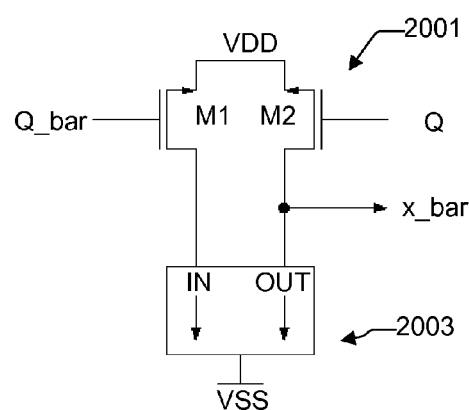
Fig. 20a        Fig. 20b

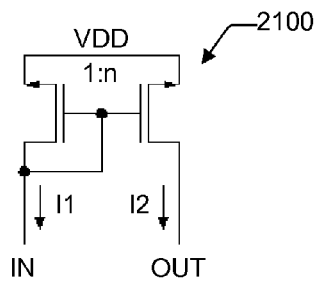
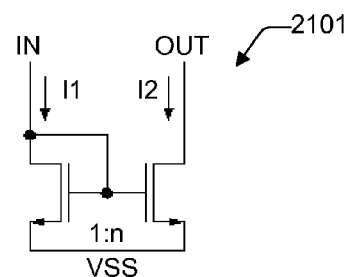
(a) PMOS
(b) NMOS
Fig. 21a
Fig. 21b
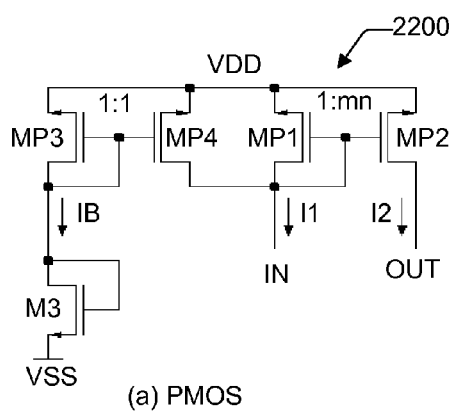
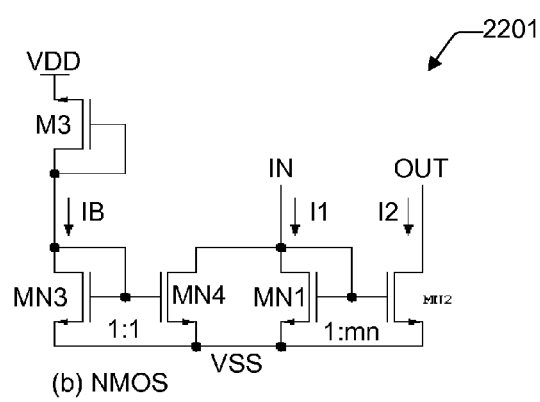
(a) PMOS
(b) NMOS
Fig. 22a
Fig. 22b
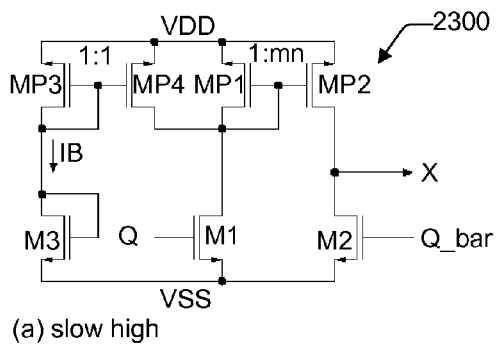
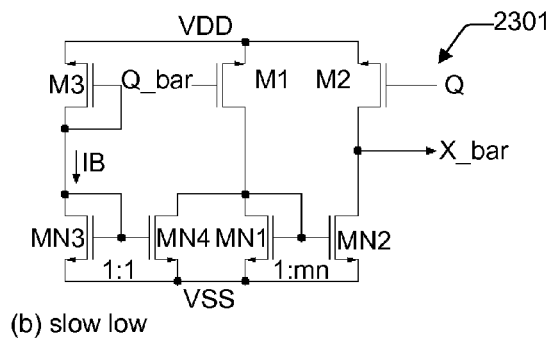
(a) slow high
(b) slow low
Fig. 23a
Fig. 23b

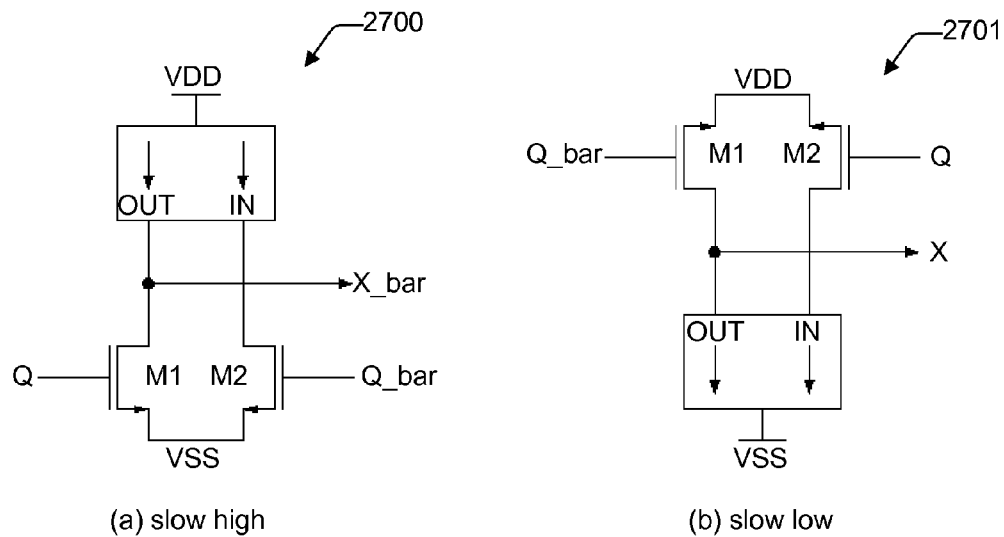
(a) slow high
Fig. 27a
(b) slow low
Fig. 27b
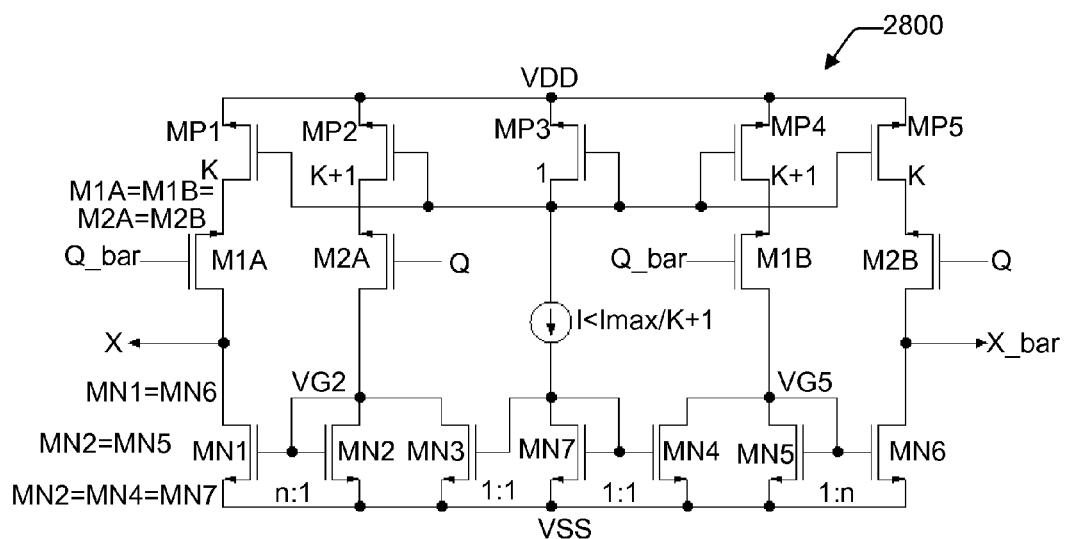
Fig. 28

CIRCUIT TO REDUCE DUTY CYCLE DISTORTION

CROSS-REFERENCE TO RELATED APPLICATIONS

The present application is a continuation-in-part of and claims priority from U.S. patent application Ser. No. 11/688,649, filed on Mar. 20, 2007, now abandoned, the entire content of which is incorporated by reference herein.

GOVERNMENT RIGHTS

The United States Government may have acquired certain rights in this invention pursuant to Contract No. DAAE30-01-0-0100 awarded by the Department of the Army.

FIELD

The present invention relates generally to the field of sigma-delta digital-to-analog converters (DACs), phase locked loops (PLLs), delay locked loops (DLLs), and other timing generators.

BACKGROUND

In many applications, such as data communications systems or sigma-delta digital-to-analog converters (DACs), it is important to accurately control the duty cycle of a digital waveform because it is the duty cycle of the waveform that contains information. In general, errors may be added to the duty cycle of a digital waveform (i.e., the waveform may be distorted) in one of two ways: either by data dependent variations in rise and fall times or by data dependent delays.

SUMMARY

A universal property of all D-type CMOS flip-flops is that the delay from the CLOCK input to the Q output is a function of the state of the D, or DATA, input at the time of the appropriate CLOCK edge. The same is also true for the "Q_bar", or inverted Q, output. This data dependent delay effect is illustrated by the timing diagram 100 in FIG. 1 for the common divide-by-two circuit 200 of FIG. 2. Note that in FIG. 2, the flip-flop's D input state equals the "Q_bar" output state. In the timing diagram 100 of FIG. 1, it is assumed that all internal gates of the flip-flop have an equal delay of Δ. It is also assumed that the CLOCK signal has a period of 10Δ, a 50% duty cycle (i.e., it is high for 5Δ and low for 5Δ), and negligible rise time. Initially, the Q output is low (Q=0) and the "Q_bar" output is high (Q_bar=1). Since the D input is also high (D=Q_bar), the Q output will go high after the first active (positive going) edge of the CLOCK signal at t=0. Note that, in this example, the Q output goes high 4Δ after the CLOCK edge. On the next active clock edge, at t=10Δ, the D=Q_bar input is low and the Q output goes low 3Δ after the CLOCK edge. At t=20Δ, this cycle starts again and Q goes high again at 4Δ after the CLOCK edge. The Q_bar output has an equal but opposite delay response to the state of the D input on the active clock edge. When D=1, the Q_bar output goes low 3Δ after the CLOCK edge (rather than 4Δ) and, when D=0, Q_bar output goes high 4Δ after the CLOCK edge (rather than 3Δ).

Consider the effect of this data dependent delay on the duty cycle, d, of the Q output. In any 20Δ period, the Q output is high for 9Δ and low for 11Δ; so that d=9/20=45%. Similarly, the Q_bar output is high for 11Δ and low for 9Δ; so that d=11/20=55%. The circuit 200 of FIG. 2 is commonly used to generate signals with a 50% duty cycle. However, as shown above, this is only an approximation. In general, the duty cycles of the Q output, $d_Q$, and the Q_bar output, $d_{Q\_bar}$, are as follows, where T represents the signal period (not the clock period).

$$d_Q = \frac{1}{2} - \Delta/T$$

$$d_{Q\_bar} = \frac{1}{2} + \Delta/T$$

In both cases, the magnitude of the error, Δ/T, is the same. Let this data dependent flip-flop error in duty cycle be represented by $d_{FFE}$ so that $$|d_{FFE}| = \Delta/T.$$

This source of duty cycle error is often overlooked and can sometimes be significant in low power CMOS systems.

By way of example, consider a 16-bit ΣΔ DAC having an output signal bandwidth of 1000 Hz. A functional block diagram of this circuit 300 is shown in FIG. 3. As shown, it consists of a D-type flip-flop 301, a voltage translator 302, and a low pass filter (LPF) 303. Not shown is the complex state machine required to generate an appropriately encoded serial data stream from the 16-bit input. It is assumed that the low pass filter 303 in this DAC 300 is an ideal 1.0 kHz brick wall filter. For sixteen bits of accuracy, the clock to the flip-flop 301 needs to have frequency of at least 131.072 MHz and the serial data stream needs to be properly encoded so as to maximize frequency content. Such encoding is commonly done with the result that when the DAC 300 is programmed for $V_{OUT}=0$, or d=½, the serial data stream to the DIN input to the flip-flop 301 is the same repeating 010101 . . . etc. sequence that is generated by the circuit 200 of FIG. 2. For a low cost CMOS process, it is not uncommon for Δ to be on the order of 0.1 to 1.0 ns. For convenience, it is assumed that Δ=0.238 ns. This leads to a duty cycle error, $d_{FFE}$, of 1.56%.

$$|d_{FFE}| = \Delta/T = 0.238 \text{ ns}/15.26 \text{ ns} = 0.0156$$

Such a DAC, programmed for zero, will produce an output voltage that is off by 3.125% of the reference voltage, $V_R$. In other words, the 16-bit DAC will have only 6 bits of accuracy!

In spite of the duty cycle error, it would not be a significant problem if the result was a constant output offset voltage. A constant offset could be compensated for either by adding an analog voltage to the output or by adding a digital constant to the upstream data. However, the error is not constant. First, the Δ varies with temperature: typically, by a factor of two or more over the full temperature range of operation. The Δ also varies significantly with process and power supply voltage. Second, the duty cycle error varies with the period of the signal, T, in proportion to the frequency of transitions in the serial data stream. In this respect, the alternating zeros and ones pattern (010101 . . . ) mentioned above is the worst case because it produces the greatest number of data transitions (one every clock cycle). Data streams with a large imbalance in the ratio of ones to zeros tend to have fewer transitions and less error. In fact, the duty cycle error for digital inputs of greater than +65,472 (or less than −64,472) is less than one LSB (15 ppm). Unfortunately, the relationship between the 16-bit data and the density of transitions in the serial data stream is highly complex. In a well designed encoder, this error function is linear: going from zero at d=0, to a peak at d=0.5, and back to zero again at d=1. However, in general, it can appear to the system as a pseudo-random source of noise having a peak magnitude of ten least significant bits (LSBs). Due to this second problem, adding an analog voltage to the filter output may not compensate for the flip-flop duty cycle distortion. Unfortunately, compensating for this effect over a large temperature range (not to mention process and supply voltage) in the serial encoder may not feasible due to the extreme complexity required, and doing so would nullify the main advantage of using a ΣΔ DAC in the first place: low cost. What is needed then is a means of reducing this duty cycle distortion at its source, the flip-flop. Particularly, it is desirable to have a digital network that delays the negative going transition of the Q output by one gate delay, Δ, but does not delay the positive going transition. Alternately, one could reduce delay distortion with a network that delays the negative going transition of the Q_bar output by one gate delay, Δ, but does not delay the positive going transition. In both cases, the network required to do this should be the same. Described in the following sections are various methods and circuits which solve the aforementioned problems.

In one example, a delay insertion gate includes first and second field effect transistors that have gates that are respectively coupled to receive first and second signals from an upstream circuit, such as an upstream data latch. The first and second signals are offset by a phase difference and are complements of each other. The delay insertion gate may further include a current mirror, which is coupled to the drain terminals of the first and second transistors. An output node of the delay insertion gate produces a duty cycle corrected signal, which has been corrected for any data dependent switching delays attributed to the upstream circuit.

Alternatively, an example method includes providing a delay insertion gate, receiving first and second signals from an upstream circuit, biasing a gate of the first transistor with the first signal, biasing a gate of the second transistor with the second signal, and outputting a duty cycle corrected timing signal at the drain terminals of the first or second transistors.

In the described examples, the first and second transistors may be matched to at least one transistor within the upstream circuit.

In an additional example, a delay insertion gate may further comprise one or more current sources that are coupled to source terminals associated with the first and second transistors. The current sources may be configured to reduce a switching delay associated with the current mirror.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Certain example embodiments are described below in conjunction with the appended drawing Figures, wherein like reference numerals refer to like elements in the various Figures, and wherein:

FIGS. 7a-c are a state diagram, state table, and schematic representation of an optimized delay insertion network respectively, according to another example.

FIG. 8 is a schematic representation of an RC network.

FIGS. 9a-b are schematic representations of delay insertion gates according to another example.

FIG. 10 is a schematic representation of a "slow high" flip-flop.

FIG. 11 is a schematic representation of a "slow low" flip-flop.

FIGS. 12a-b are state tables corresponding to the circuits of FIGS. 9a-b.

FIGS. 13a-b are schematic representations of delay insertion gates according to another example.

FIGS. 14a-b are schematic representations of delay insertion gates according to another example.

FIGS. 18a-c are a state diagram, state table, and schematic representation of an optimized delay insertion network respectively, according to another example.

FIGS. 19a-b are schematic representations of delay insertion gates according to another example.

FIGS. 20a-b are schematic representations of delay insertion gates according to another example.

FIGS. 21a-b are schematic representations of current mirrors.

FIGS. 22a-b are schematic representations of current mirrors with improved transient response.

FIGS. 23a-b are schematic representations of delay insertion gates according to another example.

FIGS. 27a-b are schematic representations of delay insertion gates according to another example.

FIG. 28 is a schematic representation of a delay insertion gate according to another example.

FIG. 32 is a timing diagram resulting from the circuit of FIG. 33a.

DETAILED DESCRIPTION

The described delay insertion gate corrects data dependent delay distortion that is generated by CMOS flip-flop circuits. The delay insertion gate may receive the data output from an upstream circuit (e.g., latch or flip-flop) and produce a duty cycle corrected signal. The delay insertion gate corrects any data dependent distortion associated with the signals received from the upstream circuit.

Figure 4:
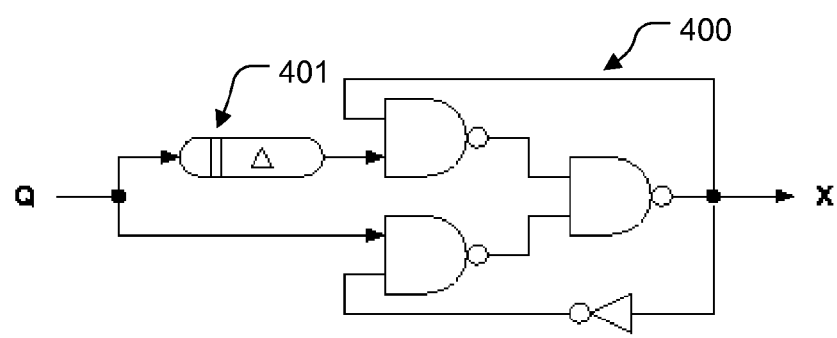
FIG. 4 is a schematic representation of a delay insertion gate according to an example.

This may be accomplished with the logic network 400 shown in FIG. 4. This circuit consists of a multiplexer controlled by its (delayed) output. The critical element in this design is a buffer 401 or delay line having a delay of one Δ.

While conceptually useful, this circuit is not completely robust. Excess layout delays in the signals fed back from the output could cause instabilities.

Figure 5A:
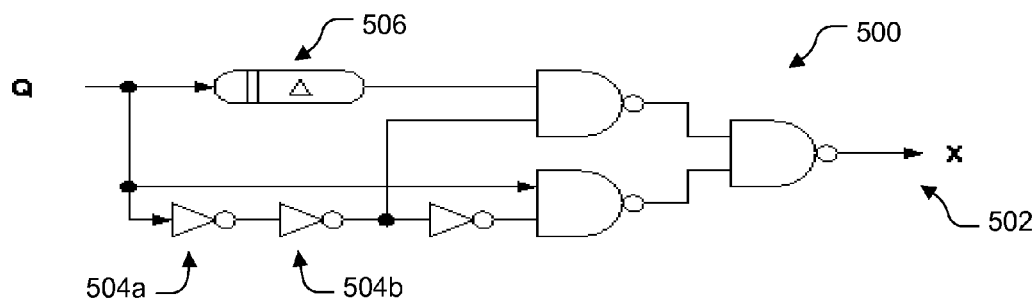
FIGS. 5a-b are schematic representations of delay insertion gates according to another example.
Figure 5B:
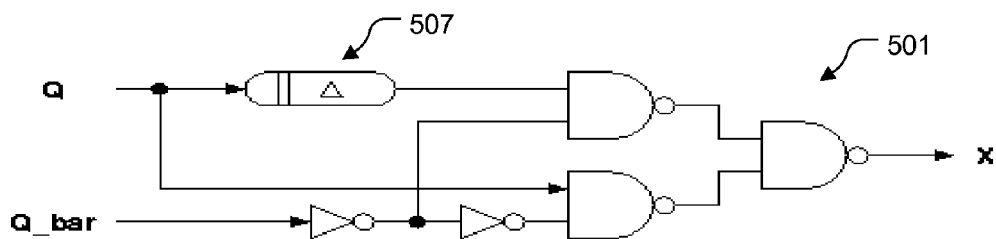

A more robust approach is shown in FIG. 5a where a delayed version of the Q signal itself is used to insert the appropriate delay when required. This circuit 500 avoids feedback from the X output but requires two additional inverters 504a-b that form a buffer. This buffer cannot be removed from the circuit because the 2Δ delay it provides is necessary. It most systems, both the Q and Q_bar outputs of a flip-flop are available. In this case, the circuit 501 of FIG. 5b may be adopted. This circuit 501 removes one of the added inverters 504a-b and reduces the load on the Q flip-flop output. In both of these designs, note again that the critical element is a buffer or delay line 506/507 having a delay of one Δ. The operation of these Delay Insertion networks is illustrated in the timing diagram 600 of FIG. 6.

Figure 6:
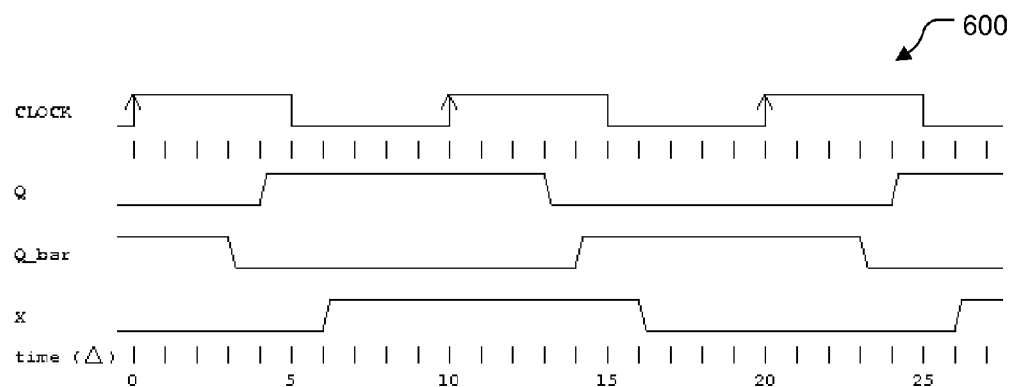
FIG. 6 is a timing diagram illustrating the result of the delay insertion gates.

An optimized delay insertion network 700 that uses both flip-flop outputs is shown in FIG. 7c. It follows the state diagram shown in FIG. 7a and the state table shown in FIG. 7b. Although this implementation uses feedback from the X output, it does not oscillate. Unlike the circuits 500/501 of FIG. 5, this circuit does not use both edges of the Q flip-flop output for timing purposes. Rather, the positive going edge of Q is used to drive the X output high and the positive going edge of Q_bar is used to drive the X output low. The timing diagram 600 corresponding to the X output of 700 is shown in FIG. 6 and is identical to the timing of the previous circuits if loading effects are not considered. Note again that the critical element in this design is a buffer or delay line 701 having a delay of one Δ.

In all of these circuits, the X output is high for 10Δ and low for 10Δ in any 20Δ period, so that, to a first order, the flip-flop delay distortion is cancelled. Unfortunately, all of these circuits depend on a buffer or delay line having a delay of one Δ. This is a weakness of the above circuits since it is extremely difficult to make a buffer in Complementary MOS (CMOS) transistor logic with a delay of one Δ. CMOS buffers are made from pairs of inverters, as shown in the circuit 500 of FIG. 5a, and have a delay that is a multiple of 2Δ.

Therefore, one could implement this 1Δ buffer is as a passive delay line. By using a simple RC network 800 as shown in FIG. 8, it is easy enough to generate the small values of delay that are typically required. However, there are two disadvantages to doing this. The first disadvantage is that the passive components are typically larger than the digital logic gates. The second disadvantage is that the temperature coefficient of the passive delay line is always different from that of the average gate delay, Δ. Therefore, it is difficult to use this technique to improve the duty cycle distortion of a flip-flop over temperature by more than a factor of two or three. In addition, process variations act to reduce this improvement. Therefore, while these networks are useful, still better performance may be desired.

The circuits 900/901 of FIGS. 9a-b overcome the various deficiencies described above. This is the type of Delay Insertion gate that would be connected to any type of flip-flop that generates the timing diagram 100 of FIG. 1 (or diagram 600 of FIG. 6); where the positive going edge in a pair of Q and Q_bar outputs always follows the negative going edge. One of many possible ways to implement such a flip-flop is shown as a circuit diagram 1000 in FIG. 10. Note that this implementation uses NOR gates 1001 in the slave portion of the flip-flop and NAND gates 1002 in the master portion.

In the circuit 1100 of FIG. 11, it is possible to obtain the other type of flip-flop where the negative going edge in a pair of Q and Q_bar outputs always follows the positive going edge by constructing the slave portion of this flip-flop with NAND gates 1102, constructing the master portion with NOR gates 1101, and removing the inverter on the CLK input (or replacing it with a buffer). For this class of flip-flops, the Delay Insertion gate 901 of FIG. 9b must be used. This type of flip-flop 1001 is referred to as a "slow low" or "high overlap" flip-flop. The type of flip-flop 1000 shown in FIG. 10 is referred to as a "slow high" or "low overlap" flip-flop.

The difference between these two variations of the basic Delay Insertion gate is that the FIG. 9a circuit 900 uses two NMOS transistors to generate an X output that roughly follows the Q flip-flop output; while the FIG. 9b circuit 901 uses two PMOS transistors to generate an X_bar output that roughly follows the Q_bar flip-flop output.

Both of the circuits 900/901 of FIGS. 9a-b cycle through a sequence of four states as illustrated in FIGS. 12a-b. For the circuit 900 of FIG. 9a, these four states are listed in FIG. 12a. When the Q input is high, transistor M1 is turned on and the X output is driven high. When the Q input goes low and while the Q_bar input is still low, both M1 and M2 are turned off and the X output is held high by the parasitic capacitance of the load connected to the X output provided by the downstream logic gate. One Δ later, the Q_bar input goes high turning on transistor M2 and driving the X output low. Then, when the Q_bar input goes low and while the Q input is still low, both M1 and M2 are off again and the X output is held low by the parasitic load capacitance. One Δ after this, the Q input goes high turning on M1 and driving the X output back high. By using the dynamic storage of the parasitic capacitance on the downstream logic gate, one may omit the static storage of the two NOR gates used in the circuit 700 of FIG. 7. Most importantly however, one may also omit the 1Δ delay line.

The circuit 901 of FIG. 9b cycles through the four states listed in FIG. 12b. When the Q_bar input is low, transistor M1 is turned on and the X_bar output is driven low. When the Q_bar input goes high and while the Q input is still high, both M1 and M2 are turned off and the X output is held low by the parasitic capacitance of the load (of the downstream logic gate) connected to the X_bar output. One Δ later, the Q input goes low turning on transistor M2 and driving the X_bar output high. Then, when the Q input goes high and while the Q_bar input is still high, both M1 and M2 are off and the X output is held high by the parasitic load capacitance. One Δ after this, the Q_bar input goes low again turning on M1 and driving the X output back low. Like the circuit 900 of FIG. 9a, this circuit 901 also uses the dynamic storage of the parasitic capacitance on the downstream logic gate to replace the static storage of the two NOR gates used in the circuit 700 FIG. 7 and the one Δ delay line.

As shown, the inverters used on the CLK inputs of the flip-flops 1000/1001, shown in FIGS. 10 and 11, set the active edge of the flip-flops to the positive going edge of the CLK input signal. Either adding or subtracting one inverter to or from the CLK input chain simply changes the active edge of the flip-flop to the negative going edge. This does not affect the operation of any of the Delay Insertion circuits.

These Delay Insertion gates do not require passive components and, over process and temperature, generally provide a better match to the gate delays of the logic used in the flip-flops. However, the effectiveness of these circuits is highly sensitive to variations in power supply voltage. This is due to the fact that the outputs of these circuits are not driven "rail-to-rail." In the circuit 900 of FIG. 9a, the maximum output voltage is below the VDD supply by one NMOS transistor threshold voltage: $V_{DD}-V_{TN}$. In the circuit 901 of FIG. 9b, the minimum output voltage is one PMOS transistor threshold voltage above the VSS supply: $V_{SS}-V_{TP}$.

Adding buffers as shown in the circuits 1300/1301 of FIGS. 13*a-b* can significantly improve the performance of the basic Delay Insertion gates 900/901 shown in FIGS. 9*a-b*. In the circuit 1300 of FIG. 13*a*, the threshold voltage of the first inverter in the buffer pair is adjusted downward (toward the VSS rail) so that the propagation delays from the Q and Q_bar inputs are equalized. In the circuit 1301 of FIG. 13*b*, the threshold voltage of the first inverter in the buffer pair is adjusted upward (toward the VDD rail) so that the propagation delays from the Q and Q_bar inputs are equalized. This technique is capable of improving flip-flop delay distortion by nearly an order of magnitude over a wide range of process and temperature variations.

The mismatch between these two propagation delays may be further reduced by simply speeding up the rise and fall times at the input to the first inverter, the common node between M1 and M2. One way of doing this, if possible, is to reduce the size of the PMOS and NMOS transistors used in the first inverter. Another way of doing this is to increase the width, and transconductance, of M1 and M2. This second approach is always possible if a pair of inverters (a buffer) is added between each FET gate terminal and the appropriate input, Q or Q_bar. This approach adds four inverters to each of the designs 1300/1301 shown in FIGS. 13*a-b*. This adds a total of six inverters (12 transistors) to each of the basic designs 900/901 shown in FIGS. 9*a-b*. However, since the basic cells of FIGS. 9*a-b* are logically symmetric, one may accomplish the same thing by replacing the buffers with inverters and swapping the basic cell used at the core of the Delay Insertion gate as shown in circuits 1400/1401 in FIGS. 14*a-b*. This approach adds a total of three inverters (6 transistors) to each of the basic designs shown in FIGS. 9*a-b* and can further reduce flip-flop delay distortion by a factor of 4×, or better, over process and temperature.

Figure 15:
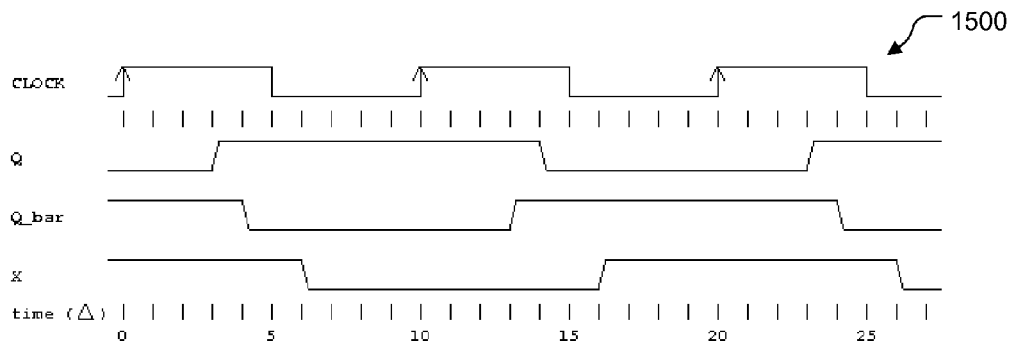
FIG. 15 is a timing diagram corresponding to the operation of the circuit of FIG. 14b.
Figure 16:
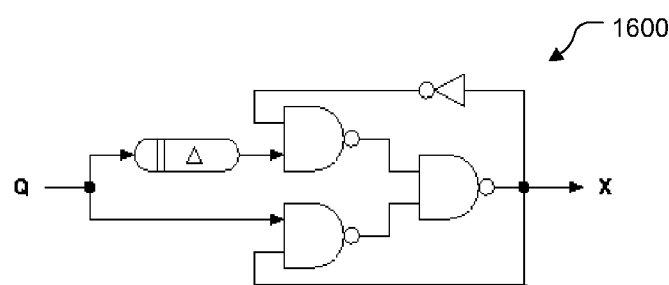
FIG. 16 is a schematic representation of a delay insertion gate according to another example.
Figure 17A:
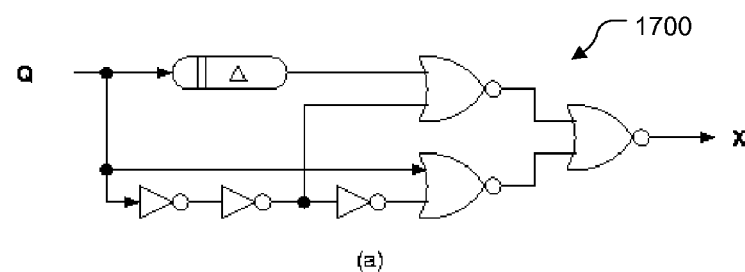
FIGS. 17a-b are schematic representations of a delay insertion gates according to another example.
Figure 17B:
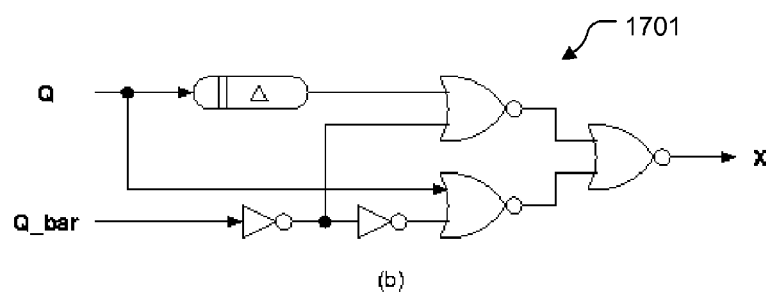

When properly designed, the Delay Insertion gates 1400/1401 of FIGS. 14*a-b* have a propagation delay of approximately 2Δ so that the circuit 1400 of FIG. 14*a* follows the same basic timing diagram 600 as FIG. 6. For reference, the timing diagram 1500 for the circuit 1401 of the FIG. 14*b* is shown in FIG. 15. The timing diagram 600 of FIG. 6 is for a "slow high" type of flip-flop where the positive going edge in a pair of Q and Q_bar outputs always follows the negative going edge. The timing diagram 1500 of FIG. 15 is for a "slow low" type of flip-flop where the negative going edge in a pair of Q and Q_bar outputs always follows the positive going edge. These are the two essential types of CMOS flip-flop that must be considered in the design of Delay Insertion gates.

Figure 1:
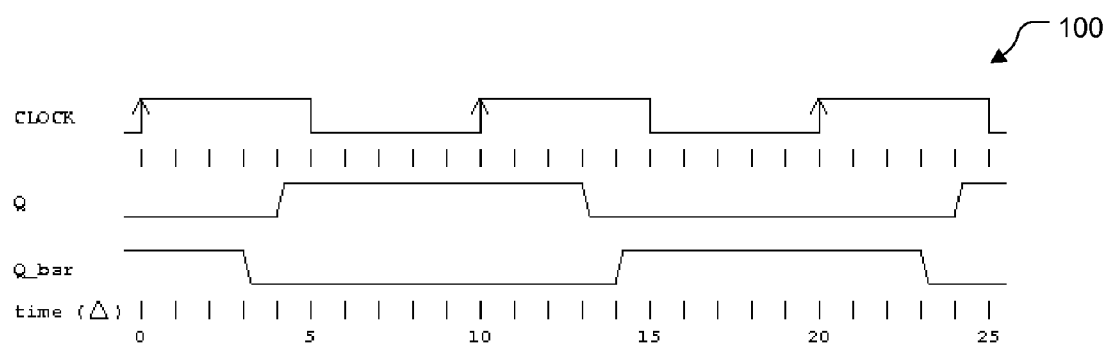
FIG. 1 is a diagram that shows how data dependent delay can cause errors in the duty cycle of a digital waveform.
Figure 2:
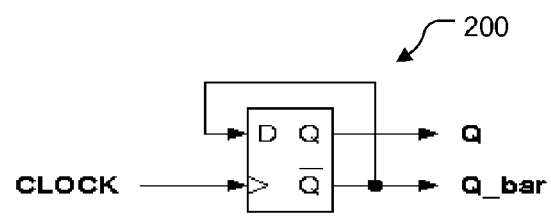
FIG. 2 is a diagram of a divide-by-two circuit.
Figure 3:
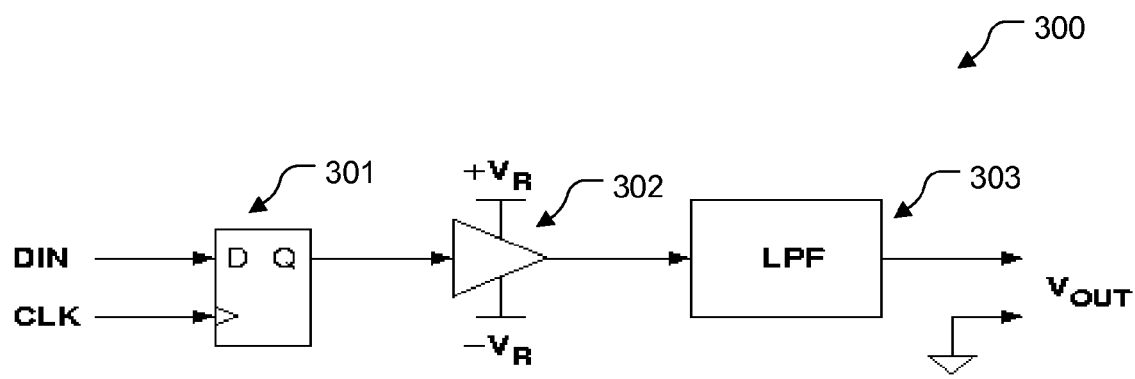
FIG. 3 is a functional block diagram of a ΣΔ DAC.

Another kind of CMOS flip-flop design variation may be illustrated in the circuit 1000 of FIG. 10 by connecting the D input to the lower NAND gate and flipping the input inverter so that the upper NAND gate is driven by the inverse of the D signal. Upon doing this, the upper output of the flip-flop must be relabeled as Q_bar and the lower output as Q so that the Q output will follow the D input. If this flip-flop is connected as a divide-by-two counter 200 (shown in FIG. 2) the timing diagram for this circuit will be exactly as shown in FIGS. 1 and 6. It is still a "slow high" type of flip-flop and the circuits of FIGS. 5, 7, 9*a*, 13*a*, and 14*a* may all be used to reduce its delay distortion. In a similar manner, inverting the D input to the flip-flop 1100 of FIG. 11 and swapping its outputs will not change its fundamental response. It will still be a "slow low" type of flip-flop and the circuits 901, 1301, and 1401 of FIGS. 9*b*, 13*b*, and 14*b* may all be used to reduce its delay distortion. For the record, the "slow low" duals of the FIGS. 4, 5, and 7 "slow high" Delay Insertion networks are shown in FIGS. 16, 17*a-b*, and 18*a-c* (respectively).

Unfortunately, the Delay Insertion gates 900/901, 1300/1301, and 1400/1401 of FIGS. 9-*ab*, 13*a-b*, and 14*a-b* are all sensitive to supply voltage variations. In the case of the circuits 1400/1401 of FIGS. 14*a-b*, this can be mitigated somewhat by adding the current sources 1902*a-b* and 1903*a-b* shown in FIGS. 19*a-b* to limit the effects of variations in M1 and M2 performance. However, a better solution is to use the circuits 2000/2001 shown in FIGS. 20*a-b*. As before, the "slow high" version 2000 is shown in FIG. 20*a* and the "slow low" version 2001 in FIG. 20*b*.

The "mirrored" Delay Insertion gates 2000/2001 of FIGS. 20*a-b* follow the same sequence of states, listed in FIGS. 12*a-b*, as the Delay Insertion gates 900/901 of FIGS. 9*a-b*. The difference is that, when transistor M1 is turned on it does not drive the output directly but instead drives the output indirectly through a 1:1 current mirror 2002/2003. If M1 and M2 are matched, they will have the same threshold voltage and this threshold voltage will match over process, temperature, and supply voltage variations. In addition, M1 and M2 will have the same on-state current so that their outputs will have equal rise and fall times.

It most systems, equal rise and fall times are desired because the threshold voltage of the downstream logic gates is near $\frac{1}{2}(V_{DD}-V_{SS})$ and this produces minimum delay distortion. However, if non-equal rise and fall times give minimum delay distortion in a particular system, this can be accommodated without an impact to M1-M2 matching by varying the current gain, n, of the current mirror.

With an "ideal" current mirror of sufficient speed, it is possible to reduce delay distortion by two orders of magnitude over a wide range of process, temperature, and supply voltage variations. This would improve the accuracy (or reduce the noise) of our hypothetical ΣΔ DAC by more than six bits.

Another advantage of the Mirrored Delay Insertion gate is that it has a rail-to-rail output and it is not necessary to add a buffer to this output just to shift the logic gate threshold voltage up or down by half of a transistor gate threshold voltage. However, depending on the load connected to these outputs, it may be advantageous to add a normal (un-shifted) buffer in order to minimize loading delays.

A difficulty in using the Mirrored Delay Insertion (MDI) gate designs 2000/2001 of FIGS. 20*a-b* is in constructing an "ideal" current mirror that is as fast as the surrounding logic. The turn-off time of the conventional current mirror designs 2100/2101, shown in FIGS. 21*a-b*, are somewhat slow. Note that the PMOS current mirror 2100 of FIG. 21*a* is used in the "slow high" Delay Insertion gate 2000 of FIG. 20*a* and the NMOS current mirror 2101 of FIG. 21*b* is used in the "slow low" Delay Insertion gate 2001 of FIG. 20*b*.

One method of improving current mirror transient response is shown in FIGS. 22*a-b*. In these current mirror circuits 2200/2201, the size of transistor M3 matches transistors M1 and M2 in FIGS. 20*a-b*. M3 is used to create a bias current $I_B$ that is equal to the current flowing through transistor M1 when the voltage on the gate terminal of M1 is approximately at the mid point between VDD and VSS, $\frac{1}{2}(V_{DD}-V_{SS})$. The value of the M3 gate voltage is set by the size of transistor MP3 (or MN3). Nominally, the ratio of MP3 to M3 (or M3 to MN3) should be the same as the PMOS to NMOS size ratio used in the surrounding logic. The ratio of MP3 to MP4 (or MN3 to MN4) is 1-to-1 so that this value of bias current is used to turn off the input to the primary current mirror, MP1 (or MN1), when transistor M1 in FIG. 20 turns off.

The circuits 2200/2201 of FIG. 22 overcome the problem of slow turn-off in the previous current mirror design but have a secondary effect that must be taken into account. Let $I_{MAX}$ be the current through either M1 or M2 when those transistors are fully driven (on). When M2 turns on, after M1 turns off, the fall (or rise) time at the output is proportional to $I_{MAX}$. However, when M1 turns on, the rise (or fall) time at the output is proportional to $I_{MAX}-I_B$. This mismatch in rise and fall times may be overcome by a further adjustment, m, to the gain of the primary current mirror. This empirical adjustment is a function of $V_{DD}-V_{SS}$ and the MOSFET threshold voltages but is typically on the order of 20%. For clarity, the circuits 2000/2001 and 2200/2201 of FIGS. 20a-b and 22a-b are combined in FIGS. 23a-b.

In CMOS logic gates, the PMOS output transistors are usually drawn to be two to three times wider than the NMOS transistors. This is due to the lower mobility of the PMOS transistors and the necessity to maintain roughly equal transconductance for the PMOS and NMOS pair. Likewise, the sizes of the PMOS transistors in the PMOS current mirrors 2100 and 2200 of FIGS. 21a and 22a are normally two to three times larger than the NMOS transistors in the NMOS current mirrors 2101 and 2201 of FIGS. 21b and 22b. Therefore, the NMOS current mirrors usually have two to three times less gate capacitance and are two to three times faster than the PMOS current mirrors. Since the performance of the Mirrored Delay Insertion gates are usually limited by the speed of their current mirrors, the "slow low" Mirrored Delay Insertion gate 2301 of FIG. 23b is preferred over the "slow high" version 2300 of FIG. 23a. Naturally, the "slow low" Mirrored Delay Insertion gate must be driven by some form of "slow low" flip-flop (see FIG. 11 for one example). Simulations indicate that the performance of this preferred configuration approaches that of a Mirrored Delay Insertion gate with an ideal current mirror.

Figures 24A, 24B:
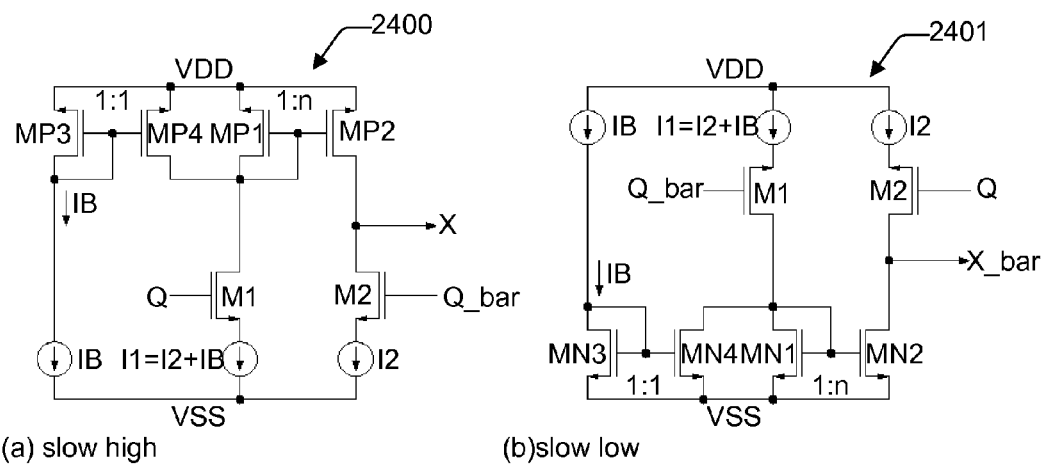
FIGS. 24a-b are schematic representations of delay insertion gates according to another example.
Figures 25A, 25B:
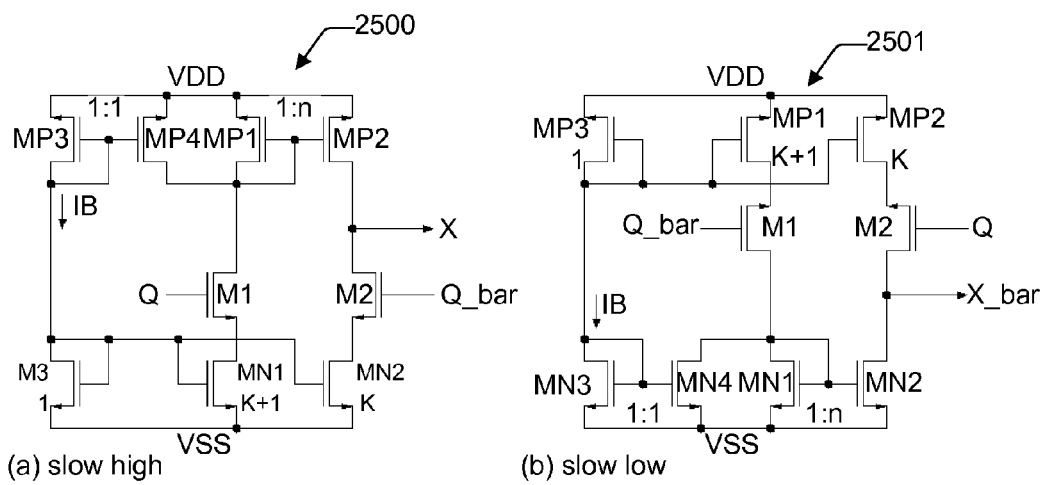
FIGS. 25a-b are schematic representations of delay insertion gates according to another example.

Finding the optimum value of the factor "m" for a given technology can be somewhat time consuming. A more robust design 2400/2401 that does not require this adjustment to the gain of the primary current mirror is shown in FIG. 24. Note that the value of $I_1$ is the sum of $I_2$ and $I_B$, $I_1=I_2+I_B$. Furthermore, $I_1$ must be less than the minimum value of $I_{MAX}$. It is advantageous if these current sources are provided by an external bias generator. However, if a bias circuit is not already available on-chip, it is not necessary to create one. It is possible to make a self-biasing version 2500/2501 of this circuit as shown in FIGS. 25a-b.

Figure 26:
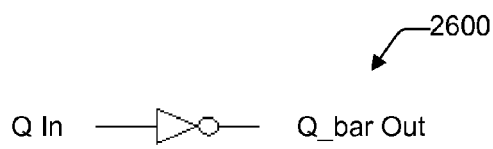
FIG. 26 is a schematic representation of a converter circuit.

Also, if a "slow low" flip-flop is not available in a given library, it is not necessary to create one. Instead, one may convert a pair of "slow high" outputs from a flip-flop to a pair of "slow low" outputs by using the simple converter circuit 2600 shown in FIG. 26. This same circuit also functions as a "slow low" to "slow high" converter.

Returning to FIGS. 20a-b, an important feature of the Mirrored Delay Insertion gates is that they may be used to produce an inverted output without any additional delay. This is done by swapping the two connections to the current mirrors to produce circuits 2700 and 2701 as shown in FIGS. 27a-b. This makes it possible to construct a differential MDI gate whose X and X_bar outputs are well matched over a wide range of process, voltage, and temperature conditions. One possible implementation of a "slow low" version of a differential MDI gate is shown in FIG. 28. The circuit 2800 shown in this Figure combines the circuits 2501 and 2701 of FIGS. 25b and 27b in a straightforward manner. Self-biasing of this circuit may be accomplished by replacing the floating current source with a short when MN7 is appropriately sized.

With a Differential MDI gate it is possible to turn off the inputs to the current mirrors by active means rather than by using a DC bias current. In fact, as shown in the circuit 2900 of FIG. 29, it is easy to do this by simply removing transistor MN7 and connecting the gates of MN3 and MN4 to the inputs of the opposite current mirror. By removing the constant bias current, it is possible for transistors MP1 and MP2 (and also MP4 and MP5) to have the same size. This circuit will provide good matching as long as the current through MP1-MP5, I, is less than $I_{MAX}$. The typical size for transistors MN3-4 is typically about half the size of transistors MN2 and MN5.

Figure 30:
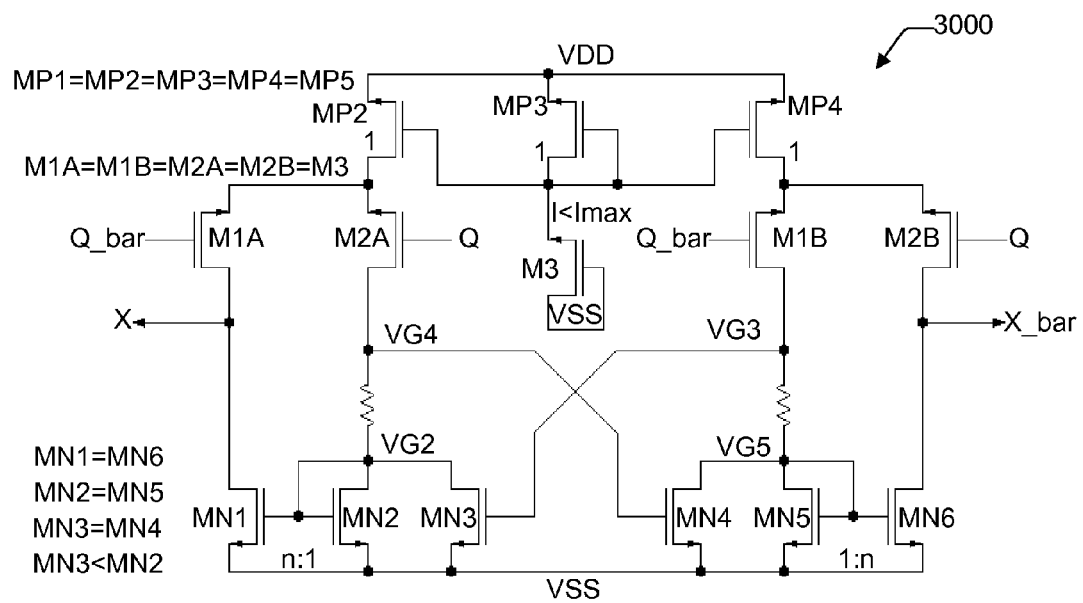
FIG. 30 is a schematic representation of a delay insertion gate according to another example.

This circuit may be made to be self-biasing by replacing the current source with a PMOS diode-connected FET as shown in the circuit 3000 FIG. 30. Making the size of this FET, M3, the same as M1A, M1B, M2A, and M2B will ensure that $I<I_{MAX}$. Since M1A and M2A are never both on at the same instant, it is also possible to optimize this circuit by removing either one of the equal current sources MP1 or MP2, and then shorting the sources of M1A and M2A together. The same is true for the other pair of matching current sources, MP4 and MP5. In FIG. 30, transistors MP1 and MP5 are omitted. It is also possible to enhance the performance of this circuit by adding two small matched resistors. When either MN3 or MN5 are turned on, these resistors provide a small amount of additional gate drive, on the order of $\frac{1}{2}V_{TN}$, that allows a reduction in the size of MN3 and MN4. Then, during turn-off, $V_{G2}$ (or $V_{G5}$) drops from about $1\frac{1}{2} V_{TN}$ to $V_{TN}$ one $\Delta$ before the voltage across MN2 (or MN5) is driven low which allows MN4 (or MN3) to be turned off sooner than it would without the resistor.

Figure 31:
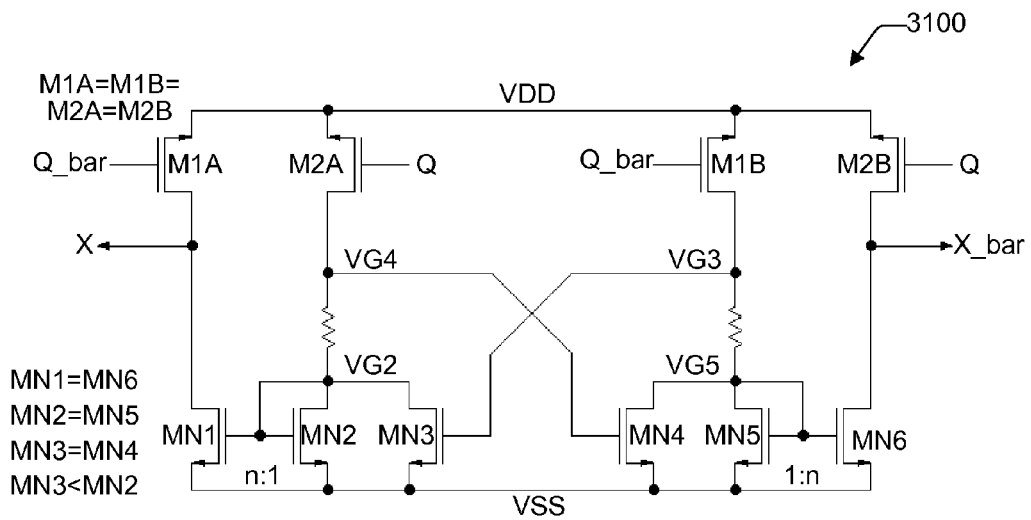
FIG. 31 is a schematic representation of a delay insertion gate according to another example.

With some degradation in performance, it is possible to simplify this circuit further by omitting transistors M3 and MP2-4 altogether. This simplified Differential Mirrored Delay Insertion gate 3100 is shown in FIG. 31.

Figure 29:
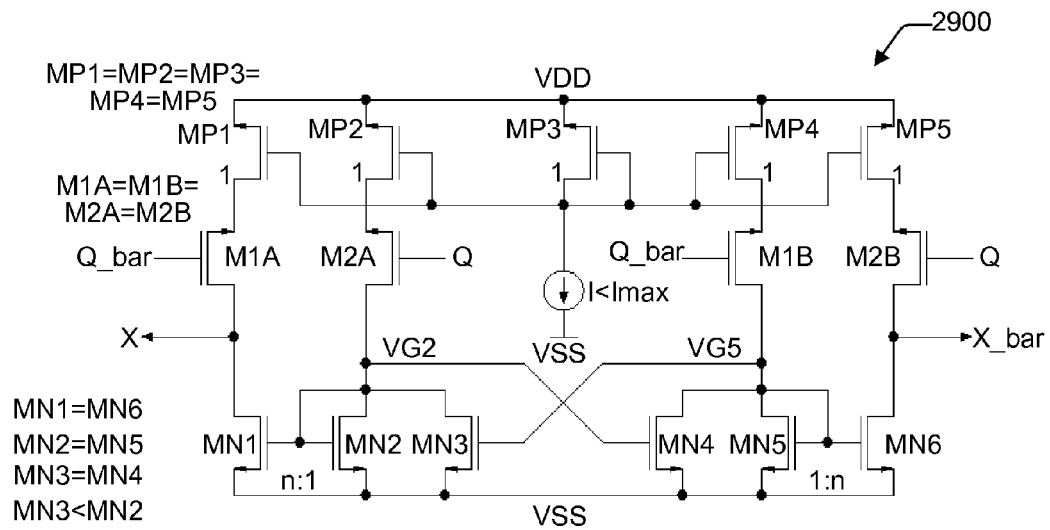
FIG. 29 is a schematic representation of a delay insertion gate according to another example.

In general, for a typical CMOS process, the Differential MDI gate 2800 of FIG. 28 will provide a greater reduction in $d_{FFE}$ than the circuits 2900 and 3000 of FIGS. 29 and 30. However, all of them produce significant reductions in $d_{FFE}$ and, because of their differential outputs, allow for further reductions in $d_{FFE}$ by using conventional means.

Figure 32:
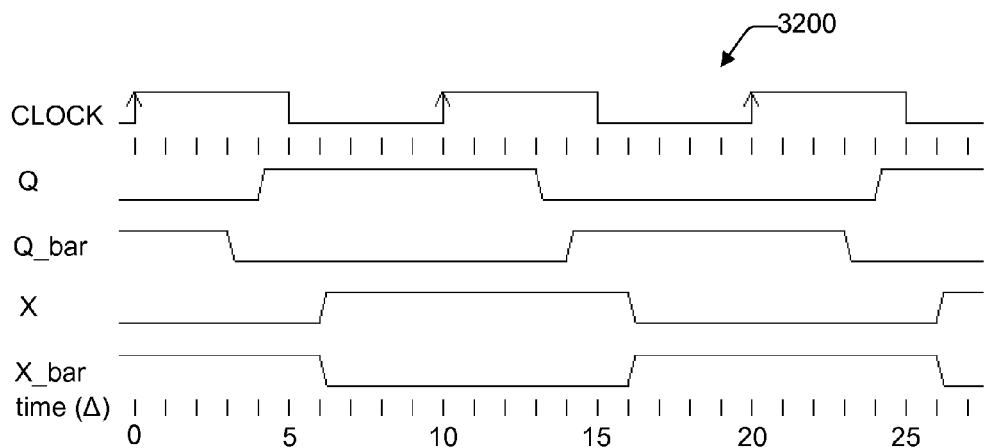
Figure 33A:
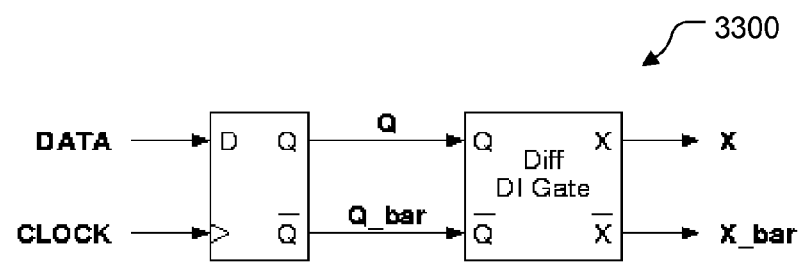
FIG. 33a is a schematic representation of a delay insertion gate coupled to a data latch.

Consider the timing diagram 3200 of FIG. 32 which shows the essential response of any Differential Delay Insertion gate connected to the output of a CMOS flip-flop as shown in the block diagram 3300 of FIG. 33a. Note that the X and X_bar outputs are coincident in time, rather than 1$\Delta$ apart, and their waveforms cross each other at roughly $\frac{1}{2}(V_{DD}-V_{SS})$. Due to this feature, it is possible to reduce $d_{FFE}$ further by adding a high-speed comparator after the Differential DI gate as shown in the circuit 3301 in FIG. 33b. A simple design for such a high speed comparator, perhaps the simplest, is presented in commonly owned U.S. Pat. No. 6,229,353. Given a comparator of sufficient bandwidth, the reduction in delay distortion afforded by this method is proportional to the voltage gain of the comparator. Typically, this technique can reduce the $d_{FFE}$ out of the Differential DI gate by an order of magnitude. If necessary, additional comparators may be cascaded to the output of the first comparator to reduce delay distortion further.

Figure 33B:
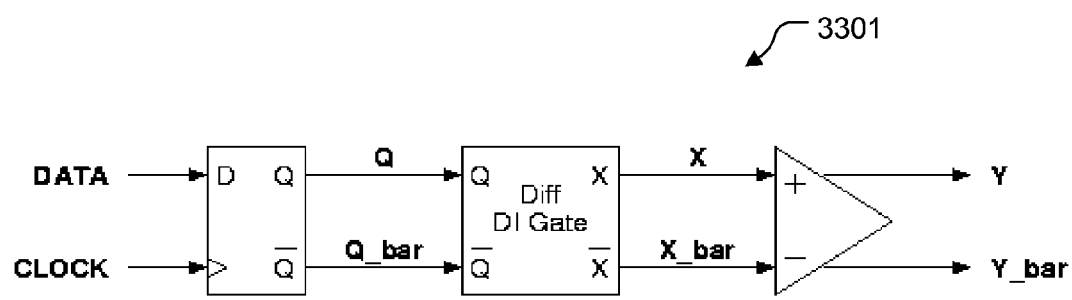
FIG. 33b is a schematic representation of a delay insertion gate and a comparator coupled to a data latch.

Returning to the hypothetical 1.0 kHz 16-bit $\Sigma\Delta$ DAC mentioned previously, it is reasonable for a Differential MDI gate 2800 from FIG. 28, when driven by a slow-low flip-flop, to reduce CMOS flip-flop delay distortion by 6 bits. In other words, to improve DAC accuracy to 12 bits from 6 bits. When the comparator of FIG. 33b is added, it is reasonable to expect a further improvement in DAC accuracy to 15 bits. Adding a second comparator could improve accuracy to the full 16 bit requirement if the comparators have sufficiently low jitter, or noise.

Those skilled in the art will understand that changes and modifications may be made to these examples without departing from the true scope and spirit of the present invention, which is defined by the claims. Thus, the presented Figures are intended to generally convey example arrangements of a delay insertion gate. Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A method, comprising:
   receiving a first transition of a first data signal from an upstream circuit, wherein the first transition is of a first transition type and includes a first propagation delay due to the upstream circuit;
   receiving a first transition of a second data signal from the upstream circuit, wherein the second data signal is a compliment of the first data signal, wherein the first transition of the second data signal is of a second transition type opposite of the first transition type, and wherein the first transition of the second data signal includes a second propagation delay due to the upstream circuit;
   outputting one of the first transition of the first data signal and the first transition of the second data signal as a first transition of a duty cycle corrected output signal based on whether the first propagation delay is greater than the second propagation delay;
   receiving a second transition of the first data signal, wherein the second transition is of the second transition type and includes a third propagation delay due to the upstream circuit;
   receiving a second transition of the second data signal, wherein the second transition is of the first transition type, and wherein the second transition includes a fourth propagation delay due to the upstream circuit; and
   outputting one of the second transition of the first data signal and the second transition of the second data signal as a second transition of the duty cycle corrected output signal based on whether the third propagation delay is greater than the fourth propagation delay.

2. The method of claim 1, wherein outputting one of the first transition of the first data signal and the first transition of the second data signal as a first transition of a duty cycle corrected output signal based on whether the first propagation delay is greater than the second propagation delay comprises:
   outputting the first transition of the first data signal if the first propagation delay is greater than the second propagation delay.

3. The method of claim 1, wherein outputting one of the first transition of the first data signal and the first transition of the second data signal as a first transition of a duty cycle corrected output signal based on whether the first propagation delay is greater than the second propagation delay comprises:
   outputting the first transition of the second data signal if the second propagation delay is greater than the first propagation delay.

4. The method of claim 1, wherein outputting one of the second transition of the first data signal and the second transition of the second data signal as a second transition of a duty cycle corrected output signal based on whether the third propagation delay is greater than the fourth propagation delay comprises:
   outputting the second transition of the first data signal if the third propagation delay is greater than the fourth propagation delay.

5. The method of claim 1, wherein outputting one of the second transition of the first data signal and the second transition of the second data signal as a second transition of a duty cycle corrected output signal based on whether the third propagation delay is greater than the fourth propagation delay comprises:
   outputting the second transition of the second data signal if the fourth propagation delay is greater than the third propagation delay.

6. The method of claim 1, wherein the first, second, third, and fourth propagation delays are based on a clock signal.

7. The method of claim 1, wherein receiving the first data signal comprises receiving the first data signal at a gate terminal of a first field effect transistor of a delay insertion gate, and wherein receiving the second data signal comprises receiving the second signal at a gate terminal of a second field effect transistor of the delay insertion gate; and
   wherein outputting the first and second transitions of the duty cycle corrected output signal comprises outputting via a corrected output node of the delay insertion gate.

8. The method of claim 7, wherein the corrected output node is coupled between the first and second field effect transistors of the delay insertion gate.

9. The method of claim 7, wherein the corrected output node is coupled to a source terminal of one of the first and second field effect transistors.

10. The method of claim 7, wherein the delay insertion gate further comprises a first current source coupled to a source terminal of the first field effect transistor, and a second current source coupled to a source terminal of the second field effect transistor.

11. A circuit comprising:
   a data latch element configured to output a first data input signal and second data signal that is a compliment of the first data signal;
   a delay insertion gate coupled to the data latch element, the delay insertion gate comprising first and second field effect transistors, a current mirror, and first and second current sources, wherein a gate of the first field effect transistor is coupled to arranged to receive the first data signal and a gate of the second field effect transistor is coupled to arranged to receive the second data signal, and wherein drain terminals of the first and second field effect transistors are coupled to the current mirror, and wherein a source terminal of the first field effect transistor is coupled to the first current source and a source terminal of the second field effect transistor is coupled to the second current source;
   an output node coupled to at least one of the drain terminals of the first and second field effect transistors; and
   wherein the delay insertion gate is configured to:
      receive a first transition of the first data signal from the data latch element, wherein the first transition is of a first transition type and includes a first propagation delay due to the data latch element;
      receive a first transition of the second data signal from the data latch element, wherein the first transition of the second data signal is of a second transition type opposite of the first transition type, and wherein the first transition of the second data signal includes a second propagation delay due to the data latch element;
      output, via the output node, one of the first transition of the first data signal and the first transition of the second data signal as a first transition of a duty cycle corrected output signal based on whether the first propagation delay is greater than the second propagation delay;

receive a second transition of the first data signal, wherein the second transition is of the second transition type and includes a third propagation delay due to the data latch element;

receive a second transition of the second data signal, wherein the second transition is of the first transition type, and wherein the second transition includes a fourth propagation delay due to the data latch element; and output, via the output node, one of the second transition of the first data signal and the second transition of the second data signal as a second transition of the duty cycle corrected output signal based on whether the third propagation delay is greater than the fourth propagation delay.

12. The circuit of claim 11, wherein the delay insertion gate is configured to:
output the first transition of the first data signal if the first propagation delay is greater than the second propagation delay.

13. The circuit of claim 11, wherein the delay insertion gate is configured to:
output one of the first transition of the first data signal and the first transition of the second data signal as a first transition of a duty cycle corrected output signal based on whether the first propagation delay is greater than the second propagation delay, and
output the first transition of the second data signal if the second propagation delay is greater than the first propagation delay.

14. The circuit of claim 11, wherein the delay insertion gate is configured to:
output the second transition of the first data signal if the third propagation delay is greater than the fourth propagation delay.

15. The circuit of claim 11, wherein the delay insertion gate is configured to:
output the second transition of the second data signal if the fourth propagation delay is greater than the third propagation delay.

16. A delay equalization network comprising:
means for receiving a first transition of a first data signal from an upstream circuit, wherein the first transition is of a first transition type and includes a first propagation delay due to the upstream circuit;
means for receiving a first transition of a second data signal from the upstream circuit, wherein the second data signal is a compliment of the first data signal, wherein the first transition of the second data signal is of a second transition type opposite of the first transition type, and wherein the first transition of the second data signal includes a second propagation delay due to the upstream circuit;
means for outputting one of the first transition of the first data signal and the first transition of the second data signal as a first transition of a duty cycle corrected output signal based on whether the first propagation delay is greater than the second propagation delay;
means for receiving a second transition of the first data signal, wherein the second transition is of the second transition type and includes a third propagation delay due to the upstream circuit;
means for receiving a second transition of the second data signal, wherein the second transition is of the first transition type, and wherein the second transition includes a fourth propagation delay due to the upstream circuit; and
means for outputting one of the second transition of the first data signal and the second transition of the second data signal as a second transition of the duty cycle corrected output signal based on whether the third propagation delay is greater than the fourth propagation delay.

17. The delay equalization network of claim 16, wherein the means for outputting one of the first transition of the first data signal and the first transition of the second data signal as a first transition of a duty cycle corrected output signal output the first transition of the first data signal if the first propagation delay is greater than the second propagation delay.

18. The delay equalization network of claim 16, wherein the means for outputting one of the first transition of the first data signal and the first transition of the second data signal as a first transition of a duty cycle corrected output signal output the first transition of the second data signal if the second propagation delay is greater than the first propagation delay.

19. The delay equalization network of claim 16, wherein the means for outputting one of the second transition of the first data signal and the second transition of the second data signal as a second transition of the duty cycle corrected output signal output the second transition of the first data signal if the third propagation delay is greater than the fourth propagation delay.

20. The delay equalization network of claim 16, wherein the means for outputting one of the second transition of the first data signal and the second transition of the second data signal as a second transition of the duty cycle corrected output signal output the second transition of the second data signal if the fourth propagation delay is greater than the third propagation delay.

* * * * *